United States Patent
Hsu et al.

(10) Patent No.: US 8,057,964 B2
(45) Date of Patent: Nov. 15, 2011

(54) PHOTOLITHOGRAPHIC RETICLES WITH ELECTROSTATIC DISCHARGE PROTECTION STRUCTURES

(75) Inventors: Che Ta Hsu, San Jose, CA (US); Peter J. McElheny, Morgan Hill, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 183 days.

(21) Appl. No.: 12/263,413

(22) Filed: Oct. 31, 2008

(65) Prior Publication Data

US 2010/0112461 A1    May 6, 2010

(51) Int. Cl.
*G03F 1/00* (2006.01)
*H01L 23/62* (2006.01)

(52) U.S. Cl. ............................................. 430/5; 257/355

(58) Field of Classification Search ................ 430/5, 22, 430/311; 174/250, 255; 355/53; 257/72, 257/355

See application file for complete search history.

(56) References Cited

U.S. PATENT DOCUMENTS

| | | | |
|---|---|---|---|
| 6,169,652 B1 | 1/2001 | Klebanoff | |
| 6,291,114 B1 * | 9/2001 | Reijers | ............................ 430/5 |
| 6,927,345 B2 * | 8/2005 | Wu et al. | ...................... 174/255 |
| 7,349,070 B2 | 3/2008 | Martin et al. | |
| 2004/0229129 A1 | 11/2004 | Allen et al. | |
| 2005/0238964 A1 | 10/2005 | Chu et al. | |
| 2007/0007534 A1 * | 1/2007 | Kim et al. | ......................... 257/72 |
| 2007/0218667 A1 * | 9/2007 | Rider | ............................. 438/585 |
| 2008/0120586 A1 | 5/2008 | Hoerold | |
| 2008/0226992 A1 * | 9/2008 | Landis et al. | ..................... 430/5 |

FOREIGN PATENT DOCUMENTS

JP    2002-055438    2/2002

* cited by examiner

*Primary Examiner* — Mark F Huff
*Assistant Examiner* — Stewart Fraser
(74) *Attorney, Agent, or Firm* — Treyz Law Group; G. Victor Treyz; Nancy Y. Ru

(57) ABSTRACT

Photolithographic reticles are provided that have electrostatic discharge protection features. A photolithographic reticle may be formed from metal structures such as chrome structures on a transparent substrate such as fused silica. Some of the metal structures on the reticle correspond to transistors and other electronic devices on integrated circuits that are fabricated when using the reticles in a step-and-repeat lithography tool. These metal device structures may be susceptible to damage due to electrostatic charge build up during handling of the reticle. To prevent damage, dummy ring structures are formed in the vicinity of device structures. The dummy ring structures may be constructed to be more sensitive to electrostatic discharge than the device structures, so that in the event of an electrostatic discharge, damage is confined to portions of the reticle that are not critical.

18 Claims, 12 Drawing Sheets

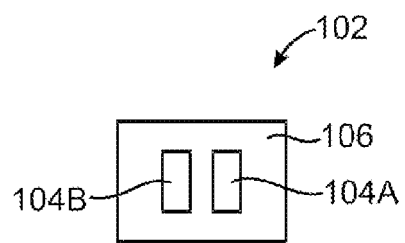
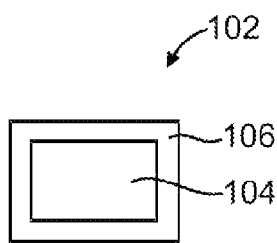
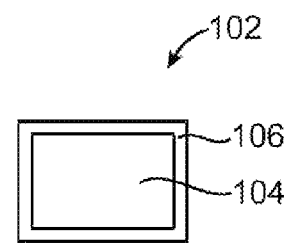
FIG. 7  FIG. 8  FIG. 9
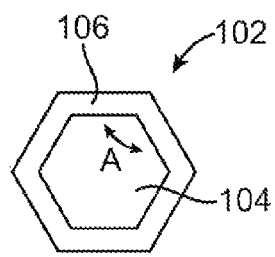
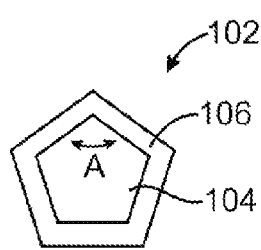
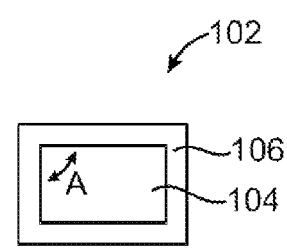
FIG. 10  FIG. 11  FIG. 12
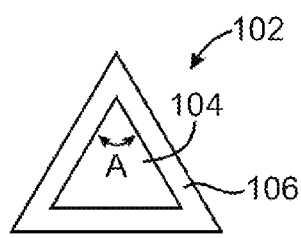
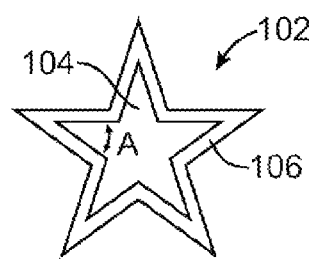
FIG. 13  FIG. 14

PHOTOLITHOGRAPHIC RETICLES WITH ELECTROSTATIC DISCHARGE PROTECTION STRUCTURES

BACKGROUND

This invention relates to photolithographic reticles, and, more particularly, to reticles with electrostatic discharge protection structures.

Integrated circuits contain patterns of conductive wires and semiconductor device structures. These patterned structures are typically less than a micron in width. Narrow features such as these are fabricated using photolithographic semiconductor manufacturing techniques.

In a typical photolithography process, templates called photolithographic reticles or photomasks are used to impress patterns of ultraviolet light rays on the surface of a semiconductor wafer. The patterned ultraviolet light is used in creating corresponding patterns in photosensitive photoresist layers on the surface of a wafer. Subsequent processing steps are used to impress the photoresist patterns on underlying material layers. For example, patterned photoresist layers may be used as etch masks for etching layers of insulator or metal. Patterned photoresist layers can also be used as implant masks.

Modern photolithography uses step-and-repeat lithographic techniques in which portions of a wafer are exposed one at a time. Step-and-repeat photolithography tools contain ultraviolet light sources and focusing optics. During operation, a desired photolithographic reticle is inserted into a holder in the step-and-repeat tool. The step-and-repeat tool is then used to repeatedly project the pattern of the reticle onto the surface a semiconductor wafer.

Reticles are typically formed from transparent fused silica substrates. Fused silica is transparent at the short wavelengths of light that are typically used in semiconductor manufacturing operations. Opaque structures are formed on the fused silica by depositing and patterning a layer of metal such as chrome. In the step-and-repeat photolithography tool, the patterned chrome (chromium) structures that are formed on the surface of the fused silica substrate are used to selectively block the ultraviolet light and thereby create a desired light pattern on the semiconductor wafer.

Fused silica is not conductive, so there is a potential for electrostatic charge to develop in the chrome layers on the surface of reticle. Charge can build up over time due to handling by an operator. For example, an operator may brush a finger against the surface of the reticle or its holder or may bring the reticle into close proximity of a charged object. Electrostatic charge can also be produced during operations such as reticle cleaning and reticle inspection operations. Even when mounted inside a step-and-repeat tool, reticles are subjected to electric fields and sources of electrostatic charge.

As the amount of electrostatic charge on a reticle builds, the risk of damage to the reticle due to an electrostatic discharge event increases. Particularly on reticles with narrow gaps between opposing metal structures, there is a risk of arcing discharge. Discharge events can damage the reticle by vaporizing or melting the chrome on the reticle. When a reticle that has been damaged in this way is used in a step-and-repeat tool, the damage may result in layout errors. Integrated circuits that are fabricated with damaged reticles may therefore not function properly.

It would therefore be desirable to be able to provide improved ways to prevent electrostatic discharge damage to photolithographic reticles used in fabricating integrated circuits.

SUMMARY

Photolithographic reticles are provided that have electrostatic discharge protection features. A photolithographic reticle may be formed from metal structures such as chrome structures on a transparent substrate such as fused silica. During semiconductor fabrication operations, a reticle may be used in a photolithography tool such as a step-and-repeat lithography tool. The reticle may be used in patterning layers on integrated circuits.

Some of the metal structures on a reticle correspond to transistors and other electronic devices on the integrated circuits that are fabricated when using the reticles in the step-and-repeat lithography tool. These metal device structures may be susceptible to damage due to electrostatic charge that builds up during use of the reticle. For example, a reticle device structure may contain a metal-free ring. If electrostatic charge builds up on the reticle, a large electric field may develop across the ring. This electric field may cause portions of the metal on the reticle in the vicinity of the ring to vaporize or melt. Damage such as this can lead to manufacturing defects in the integrated circuits that are fabricated using the reticle.

To prevent this type of damage, dummy ring structures may be formed in the vicinity of reticle device structures. The dummy ring structures may be constructed to be more sensitive to electrostatic discharge than the device structures, so that in the event of an electrostatic discharge, damage will be confined to portions of the reticle that are not critical. For example, the dummy ring structures may be formed with rings that are narrower in width than nearby device structure rings. Additional characteristics of the dummy ring structures such as their shape and size can also be selected to ensure that the dummy ring structures are sensitive to electrostatic discharge. The dummy ring structures are not used in forming circuitry on the integrated circuit, but may assist in ensuring compliance with semiconductor fabrication design rules. For example, the dummy ring structures may help a designer comply with design rules that ensure that features are not isolated in a way that would adversely affect operations such as etching and chemical mechanical polishing.

Further features of the invention, its nature and various advantages will be more apparent from the accompanying drawings and the following detailed description of the preferred embodiments.

BRIEF DESCRIPTION OF THE DRAWINGS

FIGS. 7, 8, and 9 are top views of illustrative dummy ring structures that have square outlines and gaps of varying widths in accordance with embodiments of the present invention.

FIG. 10 is a top view of an illustrative hexagonally shaped dummy ring structure with 120° interior angles in accordance with an embodiment of the present invention.

FIG. 11 is a top view of an illustrative pentagonal dummy ring structure with 108° interior angles in accordance with an embodiment of the present invention.

FIG. 12 is a top view of an illustrative square dummy ring structure showing how the interior of the dummy ring structure has four right angles in accordance with an embodiment of the present invention.

FIG. 13 is a top view of an illustrative triangular dummy ring structure with three 60° interior angles in accordance with an embodiment of the present invention.

FIG. 14 is a top view of an illustrative five-pointed star dummy ring structure with five 36° interior angles in accordance with an embodiment of the present invention.

DETAILED DESCRIPTION

The present invention relates to semiconductor fabrication technology and, more particularly, to photolithographic reticles that are suitable for use in fabricating integrated circuits. The reticles may include structures that help make them resistant to damage from electrostatic discharge events and that help the reticles comply with semiconductor fabrication design rules. Reticles such as these may be used to fabricate integrated circuits with less likelihood of reticle-induced fabrication errors.

Any suitable integrated circuits may be fabricated using the reticles. Examples of integrated circuits that may be fabricated using the reticles include application-specific integrated circuits, electrically programmable and mask-programmable programmable logic device integrated circuits, digital signal processors, microprocessors, microcontrollers, and memory chips.

During use of reticles in a semiconductor fabrication process, ultraviolet light is passed through the reticles. The reticles form patterns of ultraviolet light that are used in patterning integrated circuit structures. A typical reticle has a transparent substrate layer and a patterned opaque layer. The transparent substrate may be formed from a material such as fused silica that is transparent at ultraviolet wavelengths. The opaque layer may be formed from a material that is opaque at ultraviolet wavelengths. Typically the opaque layer is formed from a metal such as chrome (chromium). The reticles may be formed using any suitable fabrication techniques. For example, a deposited chrome layer may be patterned using lithographic techniques (e.g., deep ultraviolet lithography, electron beam lithography, etc.).

In a typical manufacturing environment, reticles are used in step-and-repeat lithography tools. Step-and-repeat lithography tools can be used to repeatedly expose photosensitive materials on the surface of a semiconductor wafer during the process of fabricating a wafer of integrated circuit die. Reticles that are used in step-and-repeat lithography tools are sometimes referred to as projection masks, because step-and-repeat lithography tools project reticle patterns onto semiconductor wafers from a distance. Noncontact lithography techniques such as the projection techniques involved in step-and-repeat lithography are generally favored over contact-type lithographic arrangements, because contact lithography tends to be less suitable for production environments. If desired, however, contact photolithography reticles (typically called photomasks or masks) may be provided with electrostatic discharge protection features. The use of noncontact reticles for step-and-repeat lithography is generally described herein as an example.

Figure 1:
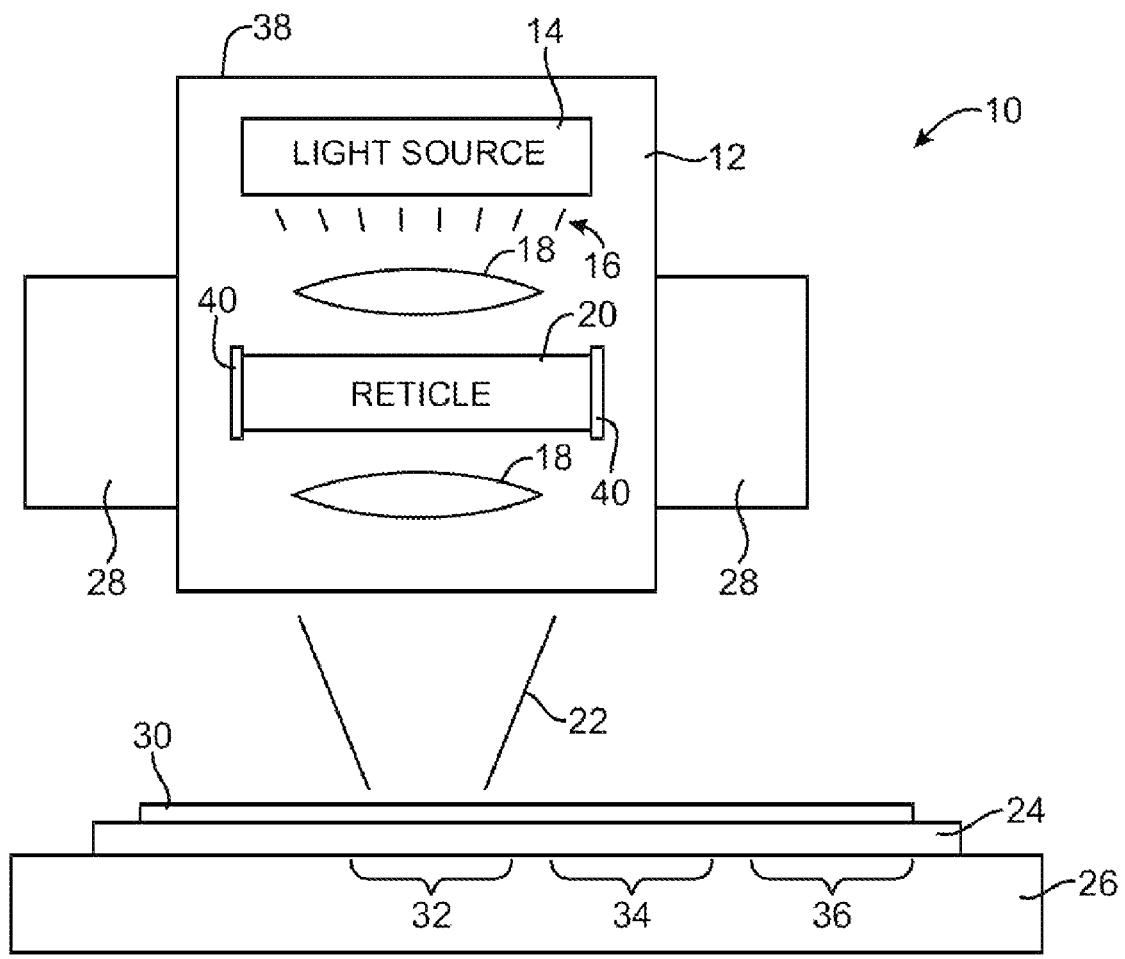
FIG. 1 is a diagram of a photolithography step-and-repeat tool that may use a photolithographic reticle in fabricating an integrated circuit in accordance with an embodiment of the present invention.

An illustrative step-and-repeat lithography tool is shown in FIG. 1. Step-and-repeat lithography tools such as tool 10 are sometimes referred to as steppers. As shown in FIG. 1, step-and-repeat lithography tool 10 may have a housing 38. Light source 14 may be located in housing 38. During operation, light source 14 may be used to generate light 16. Light source 14 may be based on a laser, lamp, or other suitable component that generates light at a desired wavelength. The wavelength of light 16 that is produced by light source 14 may be 436 nm, 365 nm, 248 nm, 193 nm, or any other suitable wavelength.

Step-and-repeat lithography tool 10 may have a reticle holder such as holder 40. Various reticles such as reticle 20 may be mounted in holder 40 during different phases of the semiconductor manufacturing process. Each reticle may contain an appropriate chrome pattern for use in lithography operations.

Optical components 18 may be used to direct light 16 through reticle 20 and onto the surface of semiconductor substrate 24. Substrate 24 may be, for example, a silicon wafer. During processing, wafer 24 may be coated with photosensitive materials such as photoresist layer 30. Photoresist layer 30 may be exposed by light 22.

Initially, light 22 may be directed on wafer 24 in a region such as region 32. Light 22 has passed through reticle 20 and contains the pattern of reticle 20. The photoresist 30 in region 32 therefore becomes exposed with the pattern that is associated with reticle 20. After the photoresist in this portion of wafer 24 has been exposed, wafer 24 is moved relative to housing 28 and optical components 18. In this new position, light 22 is directed onto wafer 24 in region 34. The position of beam 22 relative to wafer 24 may then be adjusted again so that photoresist 30 in region 36 of wafer 24 is exposed. In this way, the position of patterned light beam 22 may be stepped over the entire surface of wafer 24. Following subsequent semiconductor fabrication steps (e.g., etching, deposition, implantation, etc.), an integrated circuit will be formed in each region. For example, a first integrated circuit will be formed in wafer 24 in region 32, a second integrated circuit will be associated with region 34 of wafer 24, and a third integrated circuit will be formed from region 36.

The position of beam 22 relative to wafer 24 may be adjusted by controlling the position of beam 22, by controlling the position of wafer 24, or by making adjustments both to the position of beam 22 and wafer 24. The position of beam 22 may be controlled by adjusting the position of housing 38 and components such as reticle 20 and optics 18. As shown schematically in FIG. 1, positioning devices 28 (e.g., translation stages) may be attached to a portion of housing 38 to position beam 22. If desired, wafer 24 may be positioned using translation stages 26 or other suitable positioners.

After wafer 24 has been exposed using step-and-repeat lithography tool 10, the exposed photoresist may be developed. Subsequent processing steps such as etching steps, material deposition steps, and ion implantation steps may then be performed. After processing steps such as these have been performed, another layer of photoresist may be formed on the surface of wafer 24. Wafer 24 may then be exposed using a new reticle 20. Once all reticle patterns have been used and all desired processing steps have been performed, the semiconductor fabrication process is complete. The circuits on wafer 24 may then be tested. Following desired test operations, wafer 24 may be divided into individual die. These die may be packaged to form packaged integrated circuits.

Figure 2:
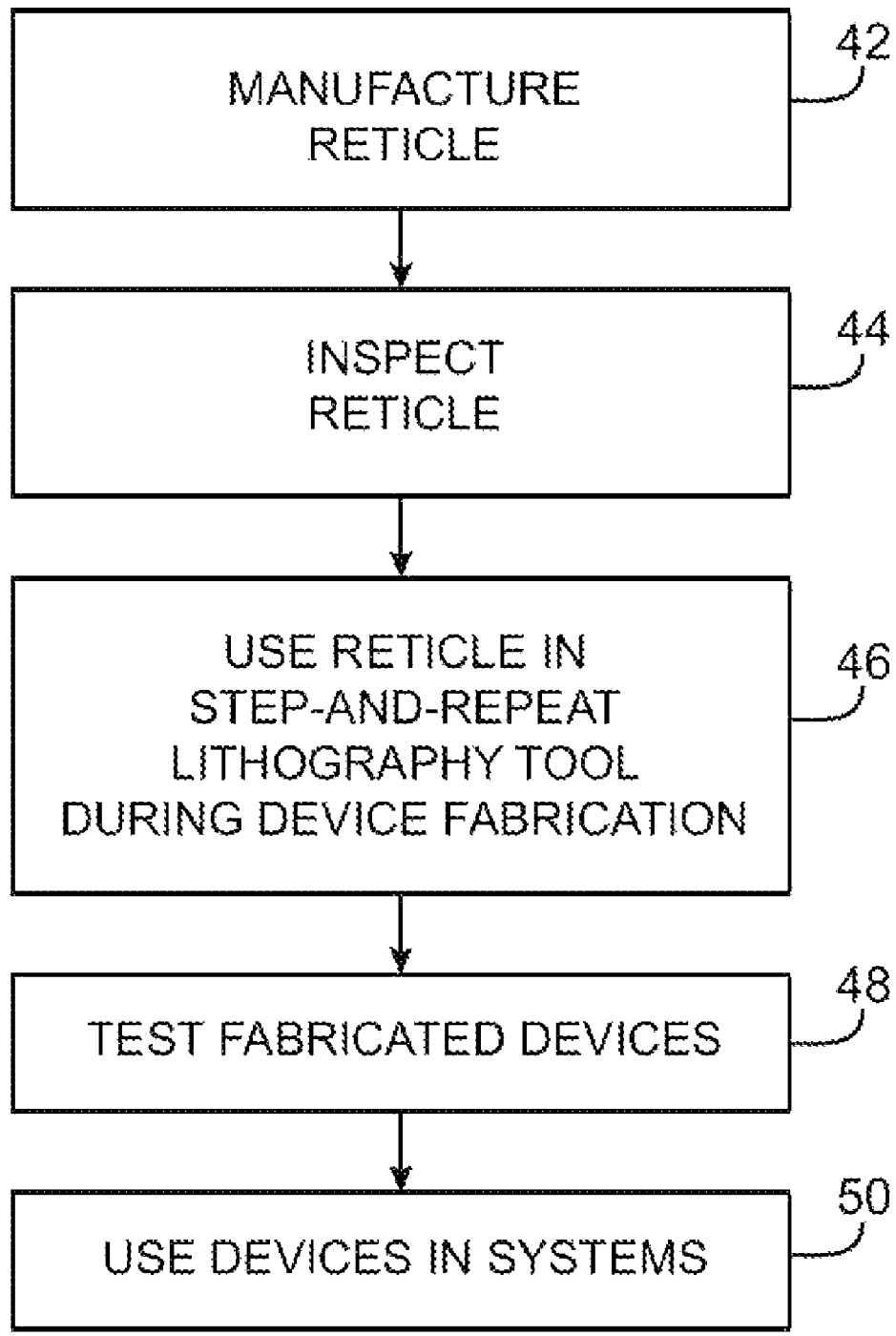
FIG. 2 is a flow chart of illustrative steps involved in fabricating semiconductor devices using reticles in accordance with an embodiment of the present invention.

Illustrative steps involve in fabricating and using reticles during semiconductor manufacturing are shown in FIG. 2.

At step 42, reticles may be manufactured. Reticles may, for example, be manufactured using electron beam or deep ultraviolet lithographic techniques. The manufactured reticles include chrome patterns for forming a desired integrated circuit. Each reticle may correspond to a different circuit layer (e.g., a contact layer, a polysilicon layer, metal layers, via layers, etc.).

At step 44, reticles may be inspected for defects. There may be, for example, unexpected voids in the chrome layer or unexpected chrome deposits. Some defects may be corrected using repair tools. Reticles that cannot be repaired may be discarded.

After the reticles have passed inspection, the reticles may be used in performing photolithographic operations. In particular, the reticles may be used in a step-and-repeat lithography tool at step 46 to pattern layers on a semiconductor wafer as needed to manufacture a desired integrated circuit.

At step 48, fabricated integrated circuits may be tested using a tester. Tests may be performed when the integrated circuits are in wafer form or may be performed after integrated circuits have been packaged.

Following successful testing, packaged integrated circuits may be mounted on a printed circuit board and used in a system (step 50).

During operations such as the operations of FIG. 2, reticles are exposed to sources of electrostatic charge. Reticles are often moved between various pieces of equipment. This equipment may include, for example, fabrication equipment, inspection equipment, and photolithography tools. Reticles may also be moved between storage containers and holders.

As reticles are exposed to these different environments, the reticles may encounter sources of charge. For example, personnel in a semiconductor manufacturing facility may inadvertently brush against the surface of the reticle (e.g., with a gloved hand or clean room garment). A reticle may also be placed in the vicinity of charged equipment. In situations such as these, electrostatic charge may be deposited in the chrome patterns on the surface of the reticle.

If charge is distributed with perfect uniformity, electric field build up will generally be minimal. Unfortunately, perfectly uniform charge distribution is rare. More typically, electrostatic charge builds up unevenly. As a result, some chrome structures on the surface of the reticle will be more highly charged than others. These electrostatic charges result in electric fields that span the gaps between unequally charged chrome structures.

Figure 3:
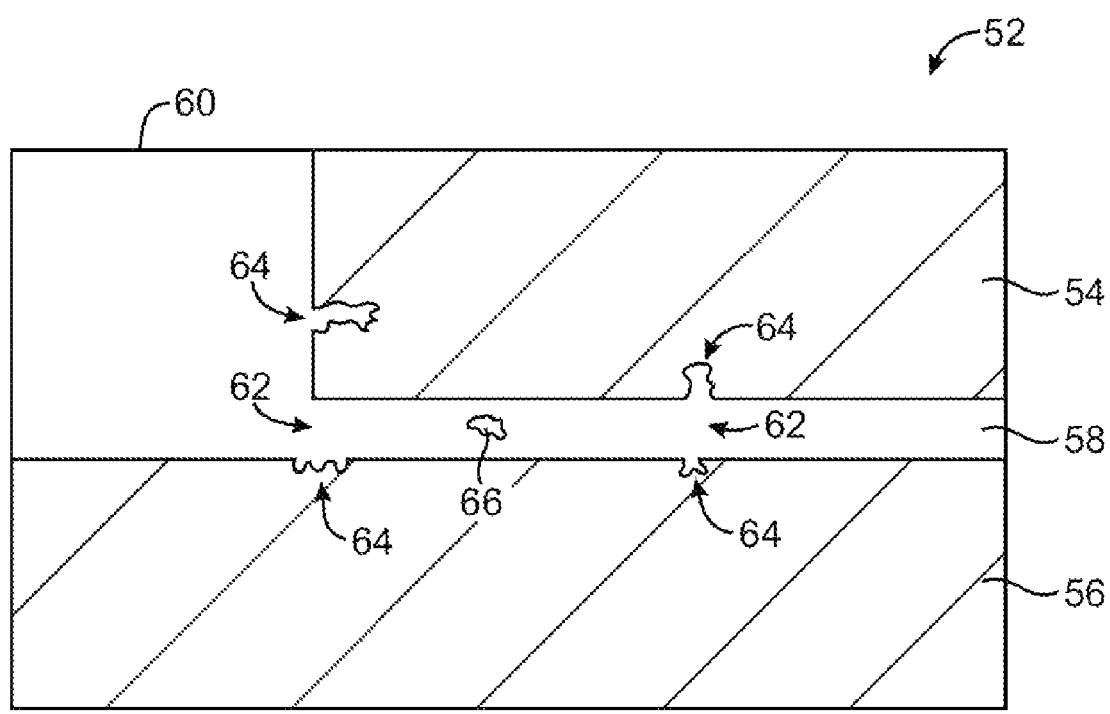
FIG. 3 is a top view of a portion of a reticle that has been damaged by electrostatic discharge events.

The size of the electric fields that are produced by this type of unintentional electrostatic charge build up can be considerable. When electric field strength becomes too large, the chrome on the reticle can be damaged. Typical forms of damage are shown in FIG. 3. In the example of FIG. 3, reticle portion 52 has two chrome structures: chrome structure 54 and chrome structure 56. Structures 54 and 56 are separated by a gap 58. When electrostatic charge builds up on structures 54 and 56, a large electric field may be produced across gap 58. If the electric field between structures 54 and 56 exceeds a critical breakdown value, an electrostatic discharge event will occur. This will damage the reticle. As shown in FIG. 3, for example, electrostatic discharge may occur in regions 62 and may result in vaporization of chrome from regions 64. Chrome may also melt or otherwise be redistributed onto reticle substrate 60 as a result of an electrostatic discharge event. In the example of FIG. 3, deposited chrome feature 66 has formed a defect in gap 58.

To prevent electrostatic discharge, it may be necessary to avoid small reticle gaps such as gap 58. Because reticle patterns may be particularly susceptible to picking up electrostatic charges when the reticle metal structures form islands with large areas, it may be particularly helpful to avoid small reticle gaps whenever an adjacent chrome region (e.g., a region such as region 54 or 56 of FIG. 3) has an area of more than a particular amount. Reticle fabrication guidelines might stipulate, for example, that no gap 58 should have a width of less than 0.35 µm whenever the area of structure 54 or 56 is greater than 4 $mm^2$ (as an example). To avoid violating these guidelines, layout designers may need to forego circuit designs that require reticle patterns with narrower gaps 58. This may cause integrated circuit performance to suffer. Another possible solution would be to create a bridging metal structure between structures 54 and 56. While this might reduce the magnitude of the voltage difference that develops between adjacent regions, the bridging structure may not be permitted by the circuit design or may reduce device performance.

Because reticles with enlarged gaps and with bridging structures may result in unacceptable device performance, it would be desirable to be able to reduce electrostatic discharge problems without the need to rely on solutions such as these.

In addition to concerns about damage from electrostatic discharge events, designers of reticles are concerned that the layouts of the reticle patterns conform to established design rules. These design rules serve as guidelines for the semiconductor fabrication process. If design rules for a given semiconductor fabrication process are not followed, integrated circuits that are fabricated with the given semiconductor fabrication process may not function properly.

To conform to semiconductor fabrication design rules, layout designers sometimes introduce dummy blocks in a reticle design. Dummy blocks are square openings in the chrome on the reticle. The presence of the dummy bocks may help ensure that design rules are followed during manufacturing. For example, the dummy blocks may help to ensure that device features are not isolated. If a device feature is not surrounded by dummy blocks, there may be insufficient process loading. This may cause the feature to be fabricated improperly. For example, during an etch process, an isolated feature may be over-etched when there are no nearby features that are being simultaneously etched. Similarly, during chemical-mechanical polishing (CMP) operations, isolated features may be planarized improperly.

Figure 4:
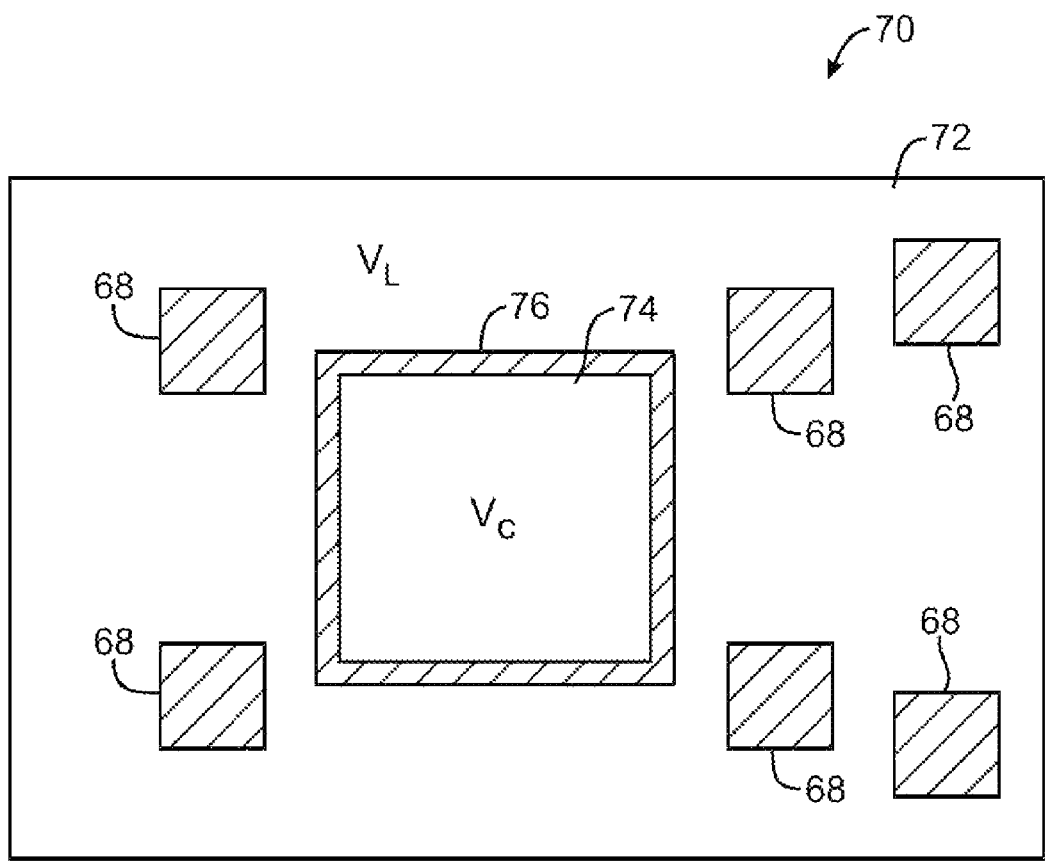
FIG. 4 is a top view of a conventional reticle that has been provided with dummy blocks to satisfy design rule requirements.

A portion of a reticle that has been provided with dummy blocks is shown in FIG. 4. As shown in FIG. 4, reticle 70 may include a device region 74. Device region 74 may correspond to a portion of an integrated circuit in which numerous transistors are formed. In the layer of the integrated circuit corresponding to reticle 70 of FIG. 4, an isolation ring is being formed around these transistors. The isolation ring is being formed by ring-shaped gap 76 in reticle 70. Gap 76 is not covered by chrome and separates chrome region 72 from inner chrome region 74.

In a finished device, transistors will lie under region 74 and will be electrically isolated by an isolation structure associated with reticle ring 76. Because this device region is relatively far from other structures, dummy blocks 68 have been provided in the vicinity of region 74. Dummy blocks 68 are square openings in chrome region 72 that ensure that the structure associated with ring 76 will be fabricated properly (e.g., during etching and chemical-mechanical polishing operations).

The presence of dummy blocks 68 may help a designer conform to semiconductor fabrication design rules, but may not help prevent damage to reticle 70 from electrostatic discharge. In fact, the reduction in area of metal region 72 may, in certain circumstances, result in an increase in the amount of electrostatic charge per unit area in region 72. This can increase the voltage difference $V_L$-$V_C$ that arises from charge built up on reticle 70, thereby leading to increased electrostatic fields and a corresponding increase in the likelihood of damage from electrostatic discharge.

Figure 5:
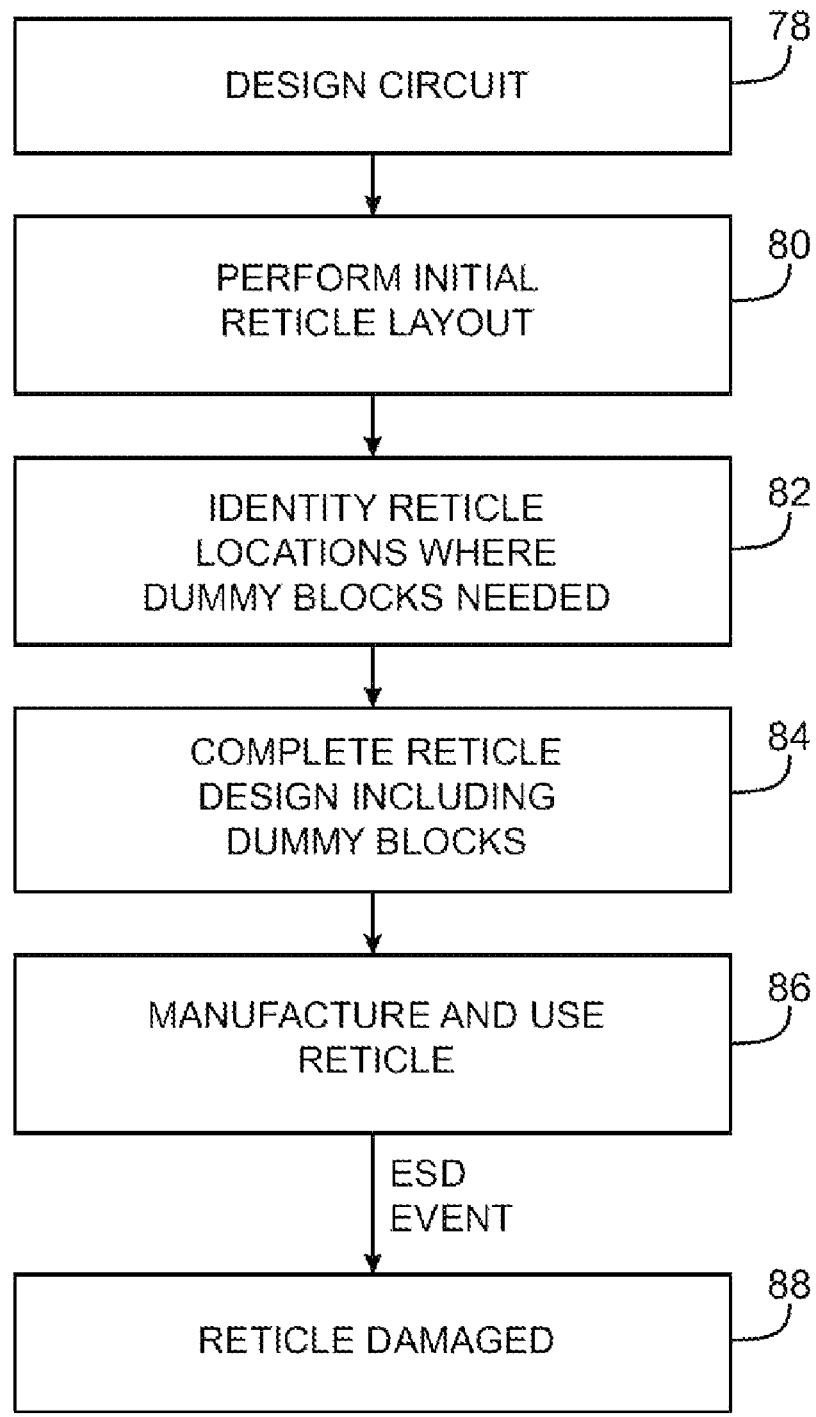
FIG. 5 is a flow chart of conventional steps for designing integrated circuits and fabricating these circuits using reticles.

These problems are illustrated in the flow chart of FIG. 5, which shows conventional steps for fabricating integrated circuits.

As shown in FIG. 5, the process generally starts with the formulation of a circuit design (step 78). A logic designer may use computer-aided design tools to design a circuit. The tools may produce an initial layout for the patterns on the reticles (step 80).

During step 82, the designer may attempt to identify problem areas such as the area around isolated device region 74 of FIG. 4

At step 84, the designer may add dummy blocks 68 in these problem areas.

At step 86, a reticle that includes the dummy blocks 68 may be manufactured.

If too much electrostatic charge arises on some of the reticle conductive structures, an electrostatic discharge (ESD) event may occur, causing reticle damage (step 88).

Figure 6:
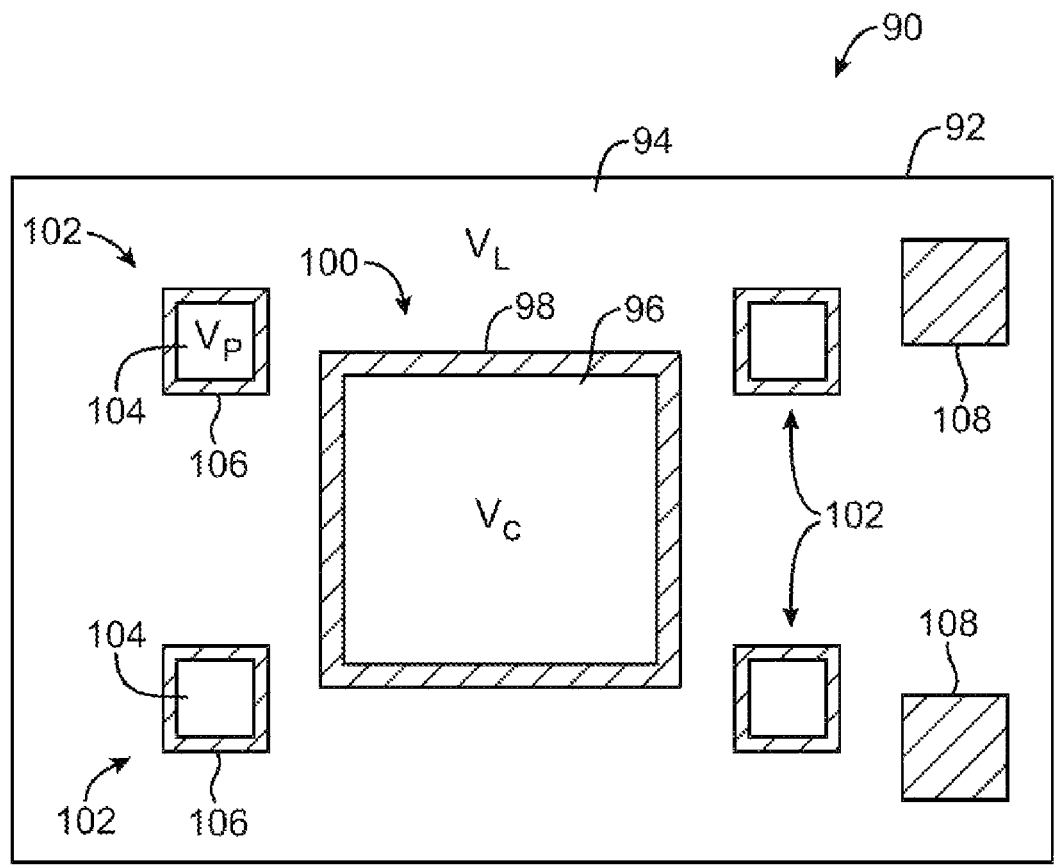
FIG. 6 is a top view of a portion of an illustrative reticle with electrostatic discharge protection dummy ring structures that help to protect the reticle from damage due to electrostatic discharge events while ensuring design rule compliance in accordance with an embodiment of the present invention.

An illustrative arrangement that may be used to help prevent electrostatic discharge damage to a reticle is shown in FIG. 6. As shown in FIG. 6, reticle 90 may be formed by placing patterned metal structures on a substrate such as substrate 92. Substrate 92 may be formed from fused silica or other suitable reticle substrate material. Opaque reticle structures such as structures 94, 96, and 104 may be formed from chrome or other suitable materials and may be patterned on the surface of reticle substrate 92. In the example of FIG. 6, these patterns include a pattern for a device structure 100 that includes a ring 98 surrounding an electrical device region 96.

Each reticle in a mask set is typically different. Some reticles are used for forming transistors and other devices on the surface of a silicon wafer. Other reticles are used in forming patterns of interconnects. In the FIG. 6 example, reticle 90 has a ring 98 that is associated with an isolation structure. Ring 98 is free of metal and forms a metal-free gap between outer metal region 94 and inner metal region 96. The other reticles associated with the same mask set include patterns for forming transistors and other devices within region 96. Accordingly, regions such as region 100, isolation ring 98, and interior region 96, may sometimes be referred to as device regions or device structures.

The devices in region 100 are necessary for the proper functioning of the integrated circuit that is being fabricated. Accordingly, electrostatic discharge damage to metal structures 94 and 96 in the vicinity of ring 98 may adversely affect the fabrication process. The width of the gap in ring 98 therefore cannot be reduced too much, as this would tend to increase the magnitude of the electric fields that are developed across the gap when electrostatic charge builds up in regions 94 and 96. Enlarging the gap in ring 98 beyond the minimum allowed by design rules would help to reduce the likelihood of damage to ring 98, but would consume undesirably large amounts of circuit area ("real estate").

Dummy structures may be formed in the vicinity of device structure 100 to ensure compliance with design rules. The formation of conventional dummy blocks of the type shown in FIG. 4 near device structure 100 may not reduce the occurrence of electrostatic discharge events or may even increase the occurrence of such events. With the arrangement of FIG. 6, however, dummy structures such as dummy ring structures 102 can be formed in the vicinity of device structure 100 that help to prevent electrostatic discharge damage to device structure 100. Dummy structures 102 may help to reduce or eliminate damage to device structure 100 by serving as sacrificial structures with an enhanced sensitivity to electrostatic discharge.

Dummy structures 102 may be constructed to be more sensitive to electrostatic charge than device-related structures such as structure 100. As a result, electrostatic charge build up will result in discharge events in structures 102, rather than in structure 100. This may cause some of the chrome in structures 102 to melt or vaporize, but will spare structure 100 from damage by discharging electrostatic charge without damaging structure 100. Damage to structures 102 will not result in defects in the integrated circuit that is fabricated using reticle 90, because dummy structures 102 do not correspond to transistors or other electrical device structures on the integrated circuit.

As shown in the FIG. 6 example, dummy structures 102 may have generally square shapes with rings 106 that separate central metal regions 104 from metal region 94. To help ensure that dummy structures 102 are more sensitive than device structure 100, structures 102 may be provided with rings 106 that have gap widths that are narrower than the gap width of ring 98 in device structure 100. For a given voltage difference across a ring, a narrower gap width will tend to result in a higher electric field strength, making it more likely that the narrow gap structure will have an electric field strength that exceeds the critical electric field strength needed to initiate an electrostatic discharge event.

It is not necessary to form all dummy structures in the vicinity of device structure 100 using dummy ring structures such as structures 102. As shown in the example of FIG. 6, some structures such as dummy block structures 108 may be formed without rings. Dummy blocks 108 are openings on substrate 92 of reticle 90 that do not contain any metal. These structures may, if desired, be located farther from device structure 100 than the dummy structures that contain metal-free rings such as dummy ring structures 102. Other arrangements may also be used such as arrangements with only dummy ring structures, arrangements with more dummy blocks or fewer dummy blocks than shown in FIG. 6, arrangements in which dummy blocks are placed closer to device structures than the dummy rings, etc. The arrangement of FIG. 6 is merely illustrative. The presence of dummy blocks 108 may help a designer comply with semiconductor fabrication design rules that prevent device structures from being too isolated. A typical design rule might specify that a reticle have a metal density of about 50%, where metal density is equal to the metal reticle area per unit of reticle area. This type of density requirement may be met by including a suitable number of structures 102 and/or structures 108 in a reticle.

Dummy ring structures 102 may have solid center regions such as the solid metal regions 104 in FIG. 6 or may have central regions that are formed from two or more sections. An illustrative dummy structure 102 that has two central metal portions 104A and 104B is shown in FIG. 7.

The sizes of center regions 104 may be enlarged or reduced as needed to accommodate rings of different sizes. As shown in FIG. 8, a dummy ring structure such as dummy ring structure 102 may be provided with a relatively wide gap 106 by using a relatively small central metal portion 104. In FIG. 9, the size of metal portion 104 is somewhat larger and the gap formed by ring 106 is somewhat narrower.

It is not necessary to form dummy ring structures 102 in a square shape. For example, dummy ring structure 102 may be formed using a hexagonal shape as shown in FIG. 10. In hexagonal dummy ring structures such as the structure of FIG. 10, central metal region 104 and ring 106 may be hexagonal. The six sides of a hexagon intersect at six vertices. A hexagon has an internal angle of 120° at each vertex. For example, the internal angles of hexagonal central region 104 such as interior angle A may each be equal to 120°.

Dummy ring structures may also be formed in the shape of pentagons, as shown by pentagonal dummy ring structure 102 of FIG. 11. As shown in FIG. 11, central region 104 and ring 106 may be characterized by interior angles A at their vertices of 108° each.

In square and rectangular dummy ring structure such as rectangular dummy ring structure 102 of FIG. 12, each interior angle A is 90°.

Another example of a dummy ring structure is shown in FIG. 13. In the example of FIG. 13, dummy ring structure 102 is formed from triangular ring 106 and has a central metal region 104 that is a triangle. The interior angles A in the triangular dummy ring structure 102 of FIG. 13 are each 60°.

In the example of FIG. 14, dummy ring structure 102 is formed from star-shaped ring 106 and has a central metal region 104 that is a star. The illustrative star of FIG. 14 has five points, but, if desired, star-shaped dummy ring structures may be provided with six or more points. The interior angles A in the five-pointed star dummy ring structure 102 of FIG. 14 are each 36°.

If desired, dummy ring structures can be formed that have curved sides, different numbers of straight sides, curved and straight sides, etc. The dummy ring structures may form triangles, squares, rectangles, or any other suitable polygonal shapes.

Figure 15:
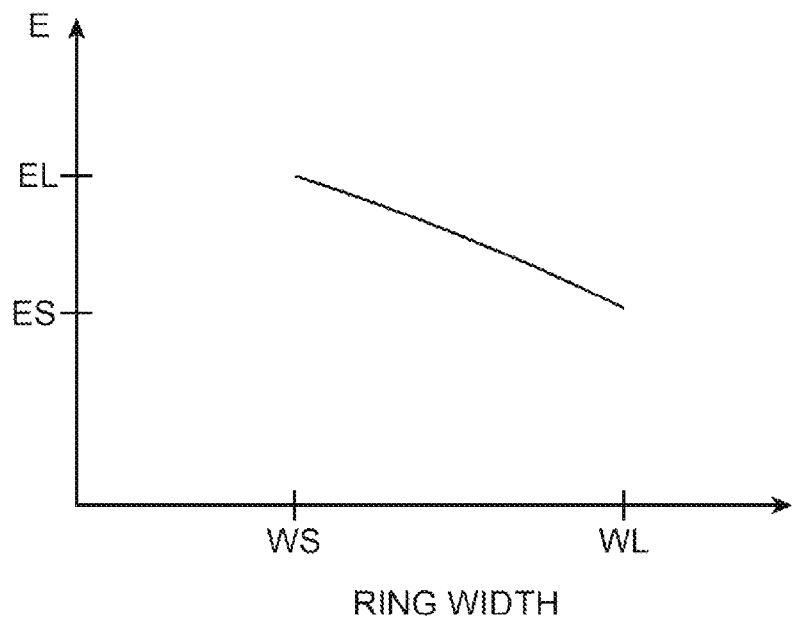
FIG. 15 is a graph showing how electrical fields that are associated with a dummy ring structure on a reticle may vary as a function of ring width in accordance with an embodiment of the present invention.

The shapes of the dummy ring structures may be selected so as to ensure that electrostatic discharge events takes place in the dummy ring structures before nearby device structures are affected. As shown in the graph of FIG. 15, for a given voltage difference between the metal structure outside of the ring in the dummy ring structure and the interior portion of the dummy ring structure, the electric field E across the ring may vary as a function of ring width. If a ring has a narrow gap width (e.g., width WS), the electric field across the gap will tend to be large (e.g., electric field EL). With the same given voltage difference, a ring with a larger width (e.g., width WL) will exhibit a smaller electric field across the ring.

Figure 16:
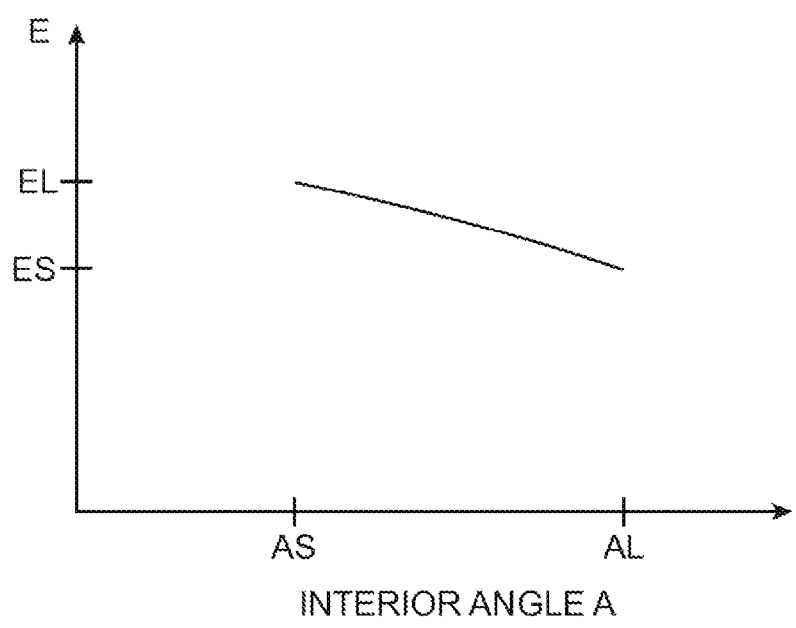
FIG. 16 is a graph showing how electrical fields that are associated with a dummy ring structure on a reticle may vary as a function of interior angle size in the dummy ring structure in accordance with an embodiment of the present invention.

Another factor that influences the sensitivity of a given dummy ring structure is the size of the minimum interior angle A. As shown in FIG. 16, structures 102 with smaller interior angles A (e.g., angle AS) tend to exhibit larger localized values of electric field E across ring 106 (e.g., electric field EL). Dummy ring structures with larger interior angles (e.g., angle AL) may result in reduced localized electric field values (e.g., electric field ES) and may therefore break down less easily than dummy ring structures with smaller interior angles.

Figure 17:
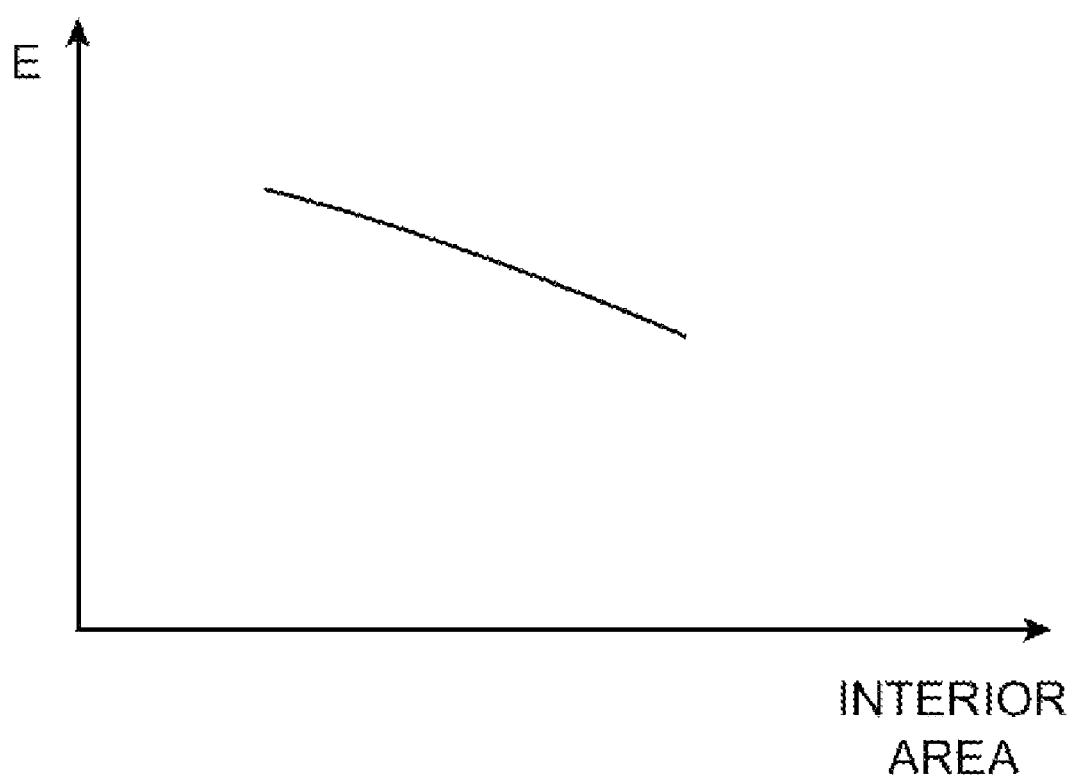
FIG. 17 is a graph showing how electrical fields that are associated with a dummy ring structure on a reticle may be influenced by interior area in a dummy ring structure in accordance with an embodiment of the present invention.

The likelihood that a given dummy ring structure will break down may also be influenced by the area of interior metal portion 104, as shown by the graph of FIG. 17. When metal portion 104 is small, it may, in some situations, be less likely to pick up a large amount of charge and may therefore reach a smaller voltage (VP of FIG. 6) than the voltage on device region 96 (e.g., VC of FIG. 6) and the voltage on exterior metal region 94 (e.g., VL of FIG. 6). The value of VC may similarly be less than the value of VL. This situation may therefore give rise to a voltage difference across dummy ring 106 (VL-VP) that is greater than the voltage difference across device ring 98 (VL-Vc) and can help to ensure that electrostatic discharge occurs across ring 106 rather than ring 98.

Figure 18:
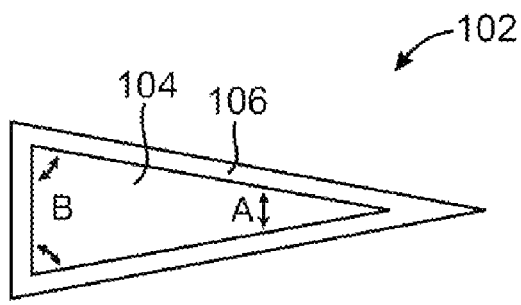
FIG. 18 is a top view of an illustrative dummy ring structure with a triangular shape and interior angles of different sizes in accordance with an embodiment of the present invention.

Factors such as these and other suitable factors may be taken into account when designing dummy ring structures. In the example of FIG. 18, dummy ring structure 102 has been provided with a triangular shape that has a small interior angle A in an effort to increase its sensitivity to electrostatic discharge.

Figure 19:
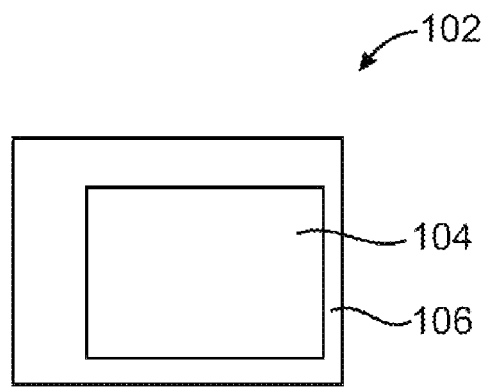
FIG. 19 is a top view of an illustrative dummy ring structure with a rectangular shape and sides of unequal widths in accordance with an embodiment of the present invention.

In the example of FIG. 19, one side of dummy ring structure 102 has been provided with a narrower gap 106, thereby increasing the likelihood that the dummy ring structure will be sensitive.

Figure 20:
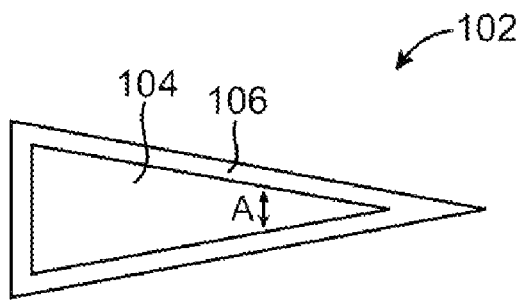
FIG. 20 is a top view of an illustrative triangular dummy ring structure having unequal interior angles and ring segments of different widths and lengths in accordance with an embodiment of the present invention.

Another possibility is illustrated in FIG. 20. In the arrangement of FIG. 20, dummy ring structure 102 has a small interior angle A and at least one side of ring 106 has a particularly narrow gap width.

The sensitivity of dummy ring structures to electrostatic discharge may also be influenced by process related parameters such as the type of process used to form the ring patterns, the type of materials used in forming portions of the reticle, localized surface treatments, additional layers of material, etc. These factors and the factors described in connection with FIGS. 15, 16, and 17 may be referred to collectively as dummy structure characteristics.

Figure 21:
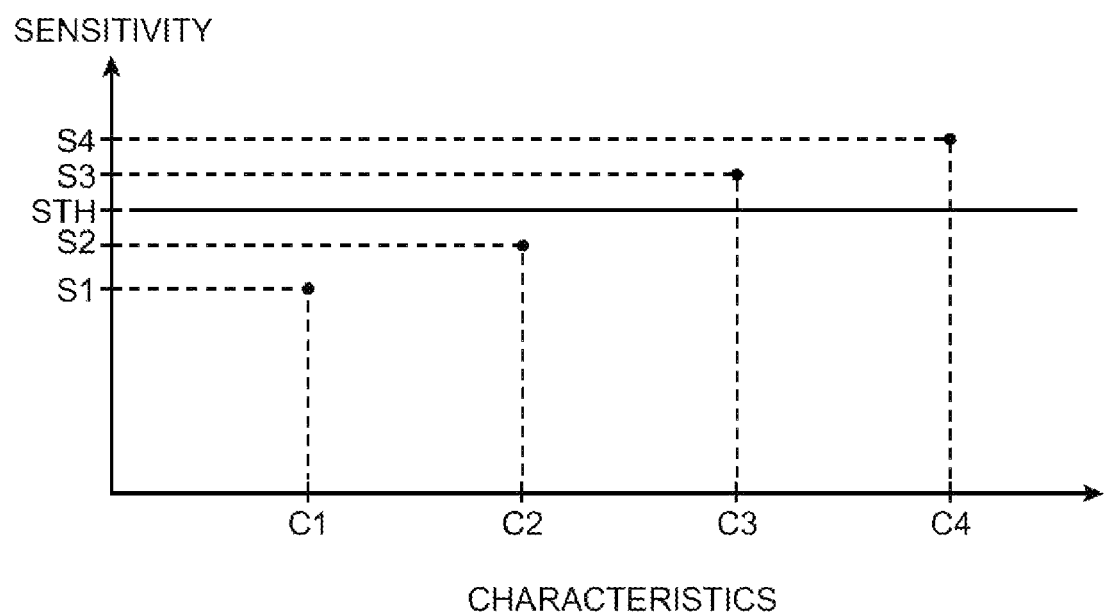
FIG. 21 is a graph showing how the sensitivity of a dummy ring structure to electrostatic discharge events can be varied by selection of a given dummy ring structure manufacturing process in accordance with an embodiment of the present invention.

As illustrated in the graph of FIG. 21, these characteristics can be chosen so that a given dummy ring structure is more sensitive to electrostatic discharge (i.e., is more likely to discharge at a given voltage difference) than a nearby device-related reticle structure that is being protected. The device structure (e.g., structure 100 of FIG. 6) might, as an example, have a sensitivity of STH. Dummy ring structures with characteristics C1 and C2 (e.g., relatively wide rings, etc.) may not be more sensitive than device structure 100 and may therefore not be suitable for protecting device structure 100 from damage. Dummy ring structures with characteristics C3 and C4, however, may be more sensitive than device structure 100. In the event of electrostatic build up, these dummy ring structures will be more likely to experience an electrostatic discharge event than device structure 100, thereby helping to prevent damage to device structure 100 that could render reticle 90 unusable.

Figure 22:
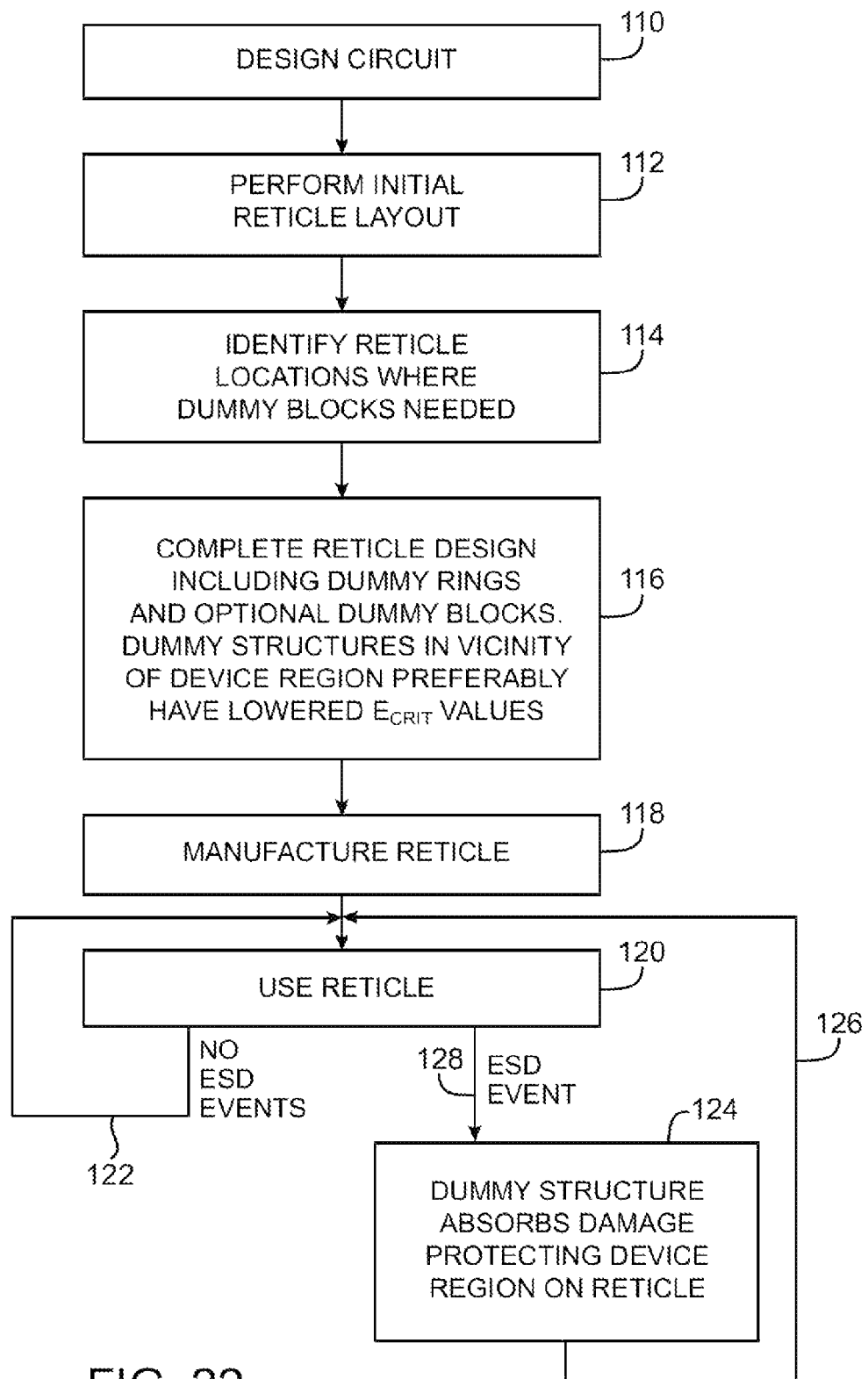
FIG. 22 is a flow chart of illustrative steps involved in using reticles with dummy ring structures in accordance with an embodiment of the present invention.

FIG. 22 shows illustrative steps involved in using reticles with dummy ring structures such as dummy ring structures 102.

At step 110, a logic designer may use a computer-aided design tool to design an integrated circuit containing transistors and other electrical devices.

At step 112, the computer-aided design tool may be used to perform mask pattern layout operations. During the operations of step 112, the computer-aided design tool is used in determining appropriate shapes for metal reticle structures and is used in determining where each metal reticle structure should be placed. These decisions on where to form each reticle structure associated with the integrated circuit may be made before dummy structures are included in the reticle patterns (as an example).

After the initial layout operations of step 112 have been completed, the computer-aided design tool may be used to identity portions of the reticle that could benefit from dummy structures. For example, the computer-aided design tool may automatically examine the initial reticle layout patterns to identity areas of metal that are larger than a given size. Reticle pattern scanning operations may be performed automatically by the computer-aided design tool or may be performed under manual control. A user of the computer-aided design tool may, for example, manually inspect portions of the design that have been automatically flagged by the tool as being pertinent. Under user control or automatically, dummy structures may then be added to the reticle design in appropriate locations (step 116). In particular, dummy ring structures 102 may be added to the design in the vicinity of device structures such as device structure 100 of FIG. 6. Dummy block structures such as dummy blocks 108 may also be included in the vicinity of device structures such as device structure 100, as described in connection with FIG. 6.

The dummy structures that are added to the reticle design may have any suitable size. For example, the dummy structures may have lateral dimension of about 5 µm to 20 µm. As an example, a dummy ring may be formed in the shape of a square having sides that are about 5 µm to 20 µm long. These dummy structures may be located in the vicinity of device structures by, for example, locating the dummy structures within a distance of 100 µm from a device structure, within a distance of 50 µm from a device structure, within a distance of 20 µm from a device structure, within a distance of 10 µm from a device structure, or within any other suitable distance of a device structure.

The dummy ring structures that are formed in the vicinity of the device structures during step 116 are preferably designed so that they are more sensitive to electrostatic discharge than the adjacent device structures. This helps to ensure that the dummy ring structures will draw electrostatic discharge events away from the device structures. The dummy ring structures may experience damage due to electrostatic discharge, but will spare critical reticle structures from damage (i.e., those device structures that are needed to fabricate an integrated circuit that is free of circuit defects). The example of FIG. 6 involves the use of a device structure 100 that includes an isolation ring structure such as ring 98 surrounding a region 96 that contains electrical devices (in other reticle layers). Dummy ring structures 102 may, however, be used to protect any suitable reticle structures from damage. The example of FIG. 6 is merely illustrative.

After ensuring that each reticle design includes desired dummy ring structures, reticles for fabricating the desired integrated circuit can be manufactured at step 118. Reticles may, for example, be manufactured by depositing chrome layers or other metal layers on an ultraviolet-transparent substrate such as a fused silica substrate and patterning the deposited metal using electron-beam or deep-ultraviolet photolithographic techniques.

The reticles with the dummy ring structures that have been fabricated at step 118 may be used to manufacture integrated circuits at step 120. Any suitable lithographic tool may be used during the semiconductor manufacturing processes of step 120. For example, the reticles may be placed in a step-and-repeat lithography tool such as tool 10 of FIG. 1.

If no electrostatic events arise, processing may continue (e.g., using a different reticle to pattern a different layer of the integrated circuit), as indicated schematically by line 122 in FIG. 22.

As indicated by line 128, electrostatic discharge events may arise during step 120. For example, electrostatic discharge events may occur during fabrication operations when a reticle is being used in a lithography tool such as tool 10 of FIG. 1. Electrostatic discharge events may also arise during other semiconductor fabrication operations such as testing operations, cleaning operation, repair operations, etc. A reticle may pick up electrostatic charge when the reticle is contacted by a user's garment or other object or when the reticle is placed in the vicinity of a charged object. The electrostatic charge may accumulate on metal reticle structures such as the metal regions in illustrative reticle 90 of FIG. 6. When conductive reticle structures become electrostatically charged in this way, voltages may build up across metal-free openings, creating electric fields. The electric fields may span gaps such as ring 98 in electric device structure 100 and rings 106 in dummy ring structure 102.

During step 116, dummy ring structures 102 were designed so as to be more sensitive to electrostatic discharge than nearby device structures (e.g., by forming the dummy ring structures with gaps that are narrower than the device structure gaps). As a result, when an electrostatic discharge event occurs (line 128), the event occurs across the gap in one of the dummy ring structures 102, rather than in the device structure 100. The dummy ring structure 102 may be damaged (step 124), but because damage is limited to the metal structures that form the dummy ring structure, the device structures are not affected. Defects in the dummy ring structures that arise from the electrostatic discharge event such as the pitted and melted features of FIG. 3 will not influence the performance of the integrated circuit that is being manufactured, because the dummy ring structure is not used to form circuitry in the integrated circuit.

Electrostatic discharge events tend to discharge the built up charge on the reticle structures. This helps to prevent additional electrostatic discharge events that might damage reticle structures. As indicated by line 126 in FIG. 22, it is therefore possible to continue to use the reticle on which the dummy ring structure electrostatic discharge event took place.

The foregoing is merely illustrative of the principles of this invention and various modifications can be made by those skilled in the art without departing from the scope and spirit of the invention.

What is claimed is:

1. A photolithography reticle, comprising:
a transparent substrate; and
metal patterns on the transparent substrate that are configured to form at least one ring structure having a solid metal center region surrounded by a metal-free ring, wherein the at least one ring structure forms an electrostatic discharge protection structure, wherein the metal patterns are further configured to form at least one device structure ring, wherein the device structure ring has a first width, wherein the metal-free ring has a second width that is less than the first width and wherein the at least one device structure ring is associated with an isolation structure in a finished device.

2. The photolithography reticle defined in claim 1 wherein the metal patterns of the ring structure include an outer metal region, wherein the outer metal region and the solid metal center region are electrically separated from each other by the metal-free ring.

3. The photolithography reticle defined in claim 1 wherein the metal-free ring comprises a polygonal metal-free ring.

4. The photolithography reticle defined in claim 1 wherein the metal-free ring comprises a rectangular metal-free ring.

5. The photolithography reticle defined in claim 4 wherein the rectangular metal-free ring has at least first and second segments, each segment having an associated width and wherein the width of the first segment is different than the width of the second segment.

6. The photolithography reticle defined in claim 1 wherein the metal-free ring comprises a triangular metal-free ring.

7. The photolithography reticle defined in claim 6 wherein the triangular ring has at least first and second segments, each segment having an associated width and wherein the width of the first segment is different than the width of the second segment.

8. The photolithography reticle defined in claim 6 wherein the triangular ring has three equal interior angles.

9. The photolithography reticle defined in claim 6 wherein the triangular ring has three segments at least two of which are of unequal length.

10. The photolithography reticle defined in claim 1 wherein the metal-free ring has at least one interior angle of less than 90°.

11. The photolithography reticle defined in claim 1, wherein the device structure ring has a minimum width, wherein the metal-free ring has at least one segment with a width that is less than the minimum width, and wherein the metal-free ring is located within 100 µm of the device ring structure.

12. The photolithography reticle defined in claim 1, wherein the metal-free ring comprises a dummy metal-free ring that assists in ensuring compliance with semiconductor fabrication design rules specifying a metal reticle area per unit of reticle area for the photolithography reticle.

13. A photolithographic reticle, comprising:
a substrate;
conductive material on the substrate that forms at least one electrostatic discharge protection structure, wherein the at least one electrostatic discharge protection structure comprises a solid center metal region surrounded by a metal-free ring, and
at least one metal device structure, wherein the metal device structure has an associated metal-free ring with a first width, wherein the metal-free ring of the electrostatic discharge protection structure has a second width that is less than the first width, and wherein the associated metal-free ring corresponds to an isolation structure in a finished device.

14. The photolithographic reticle defined in claim 13, wherein the electrostatic discharge protection structure is more sensitive to electrostatic discharge than the at least one metal device structure.

15. The photolithographic reticle defined in claim 13 further comprising patterned metal regions that correspond to electrical devices on an integrated circuit, wherein the electrostatic discharge protection structure does not correspond to the electrical devices on the integrated circuit.

16. The photolithographic reticle defined in claim 13, wherein the at least one metal device structure has a central metal region with a first area and wherein the electrostatic discharge protection structure has a central metal region with a second area that is less than the first area.

17. The photolithographic reticle defined in claim 13 wherein the electrostatic discharge protection structure does not correspond to any integrated circuit device structures.

18. The photolithographic reticle defined in claim 13 wherein the metal-free ring of the electrostatic discharge protection structure comprises a dummy metal-free ring that assists in ensuring compliance with semiconductor fabrication design rules specifying a metal reticle area per unit of reticle area for the photolithography reticle.

\* \* \* \* \*